– Primary Examiner—Eugene R. LaRoche
Assistant Examiner—Steven J. Mottola
Attorney, Agent, or Firm—Oblon, Fisher, Spivak, McClelland & Maier

United States Patent [19]
de Corlieu et al.

[11] Patent Number: 4,588,956
[45] Date of Patent: May 13, 1986

[54] WIDE BAND AMPLIFIER-LIMITER DEVICE

[75] Inventors: Patrick de Corlieu; Jacques Bursztejn, both of Paris, France

[73] Assignee: Alcatel Thomson Faisceaux Hertziens, Levallois Perret, France

[21] Appl. No.: 673,936

[22] Filed: Nov. 21, 1984

[30] Foreign Application Priority Data

Nov. 25, 1983 [FR] France ................. 83 18849

[51] Int. Cl.$^4$ ................. H03F 3/68
[52] U.S. Cl. ................. 330/2; 330/302; 330/310
[58] Field of Search ........... 330/2, 278, 291, 302, 330/306, 307, 310, 311

[56] References Cited

U.S. PATENT DOCUMENTS

| 3,678,405 | 7/1972 | Avins ................. | 330/260 |
| 3,909,725 | 9/1975 | Baghdady ............. | 325/347 |
| 4,429,416 | 1/1984 | Page ................. | 330/2 X |

OTHER PUBLICATIONS

Elektronik, vol. 27, No. 13, Nov. 1978, pp. 58–60, Munich (DE); A. Kussmaul: "Logarithmischer Verstarker zur Anzeigebereich Erweiterung".

IEEE Journal of Solid–State Circuits, vol. SC-3, No. 4, Dec. 1968, pp. 397–401, New York (USA), J. J. Rongen: "Stability Considerations in Monolithic Integrated Circuit Amplifier Limiters".

Electronics, vol. 40, No. 6, Mar. 20, 1967, pp. 88–89, New York (USA); R. Q. Lane: "Low–cost IC's Improve 45–MHz i-f Amplifier".

[57] ABSTRACT

An amplifier-limiter device intended to amplify a received signal up to a predetermined value. The device comprises 2n integrated circuits of the emitter coupled logic type which are connected in series, these integrated circuits forming n successive pairs and each pair having associated with it a compensating circuit which compensates for the linear distortion caused by the integrated circuits of the pair.

5 Claims, 2 Drawing Figures

WIDE BAND AMPLIFIER-LIMITER DEVICE

BACKGROUND OF THE INVENTION

The present invention relates to an amplifierlimiter device.

It is known that devices of this nature may be utilised, for example, in wide band Hertzian beam receivers. The known devices comprise an amplifier of the automatic gain control type, followed by an amplitude limiter. For particular applications, such as the aiming of the antenna of a receiver at the maximum energy received, it is necessary to have an auxiliary output which supplies a voltage proportional to the power of the signal received. In the case of the known amplifiers-limiters, it is the automatic gain control signal which represents this voltage.

There are no automatic gain control amplifiers produced as integrated circuits which are able to be utilized for the amplifier-limiter devices. This has the result that the amplifier-limiter devices have a comparatively high power consumption and are of high cost.

SUMMARY OF THE INVENTION

The present invention has as its particular object to reduce the disadvantages mentioned above.

This is accomplished by utilising existing integrated circuits of the line receiver type associated with circuits compensating for the linear distortion introduced by these integrated circuits.

According to the invention there is provided an amplifier-limiter device which comprises: a signal input and a signal output, 2n integrated logic circuits of the line receiver emitter coupled type (n being an integer at least equal to 1), 2n+1 connections for establishing a coupling in series of the 2n circuits between the signal input and output, these 2n circuits forming n pairs of successive and separate circuits, and n compensating circuits associated with the n pairs respectively, for compensating the linear distortion caused by the n pairs.

BRIEF DESCRIPTION OF THE DRAWINGS

The present invention will be better understood and other features will emerge from the following description and from the accompanying drawings, in which.

DESCRIPTION OF THE PREFERRED EMBODIMENTS

Figure 1:
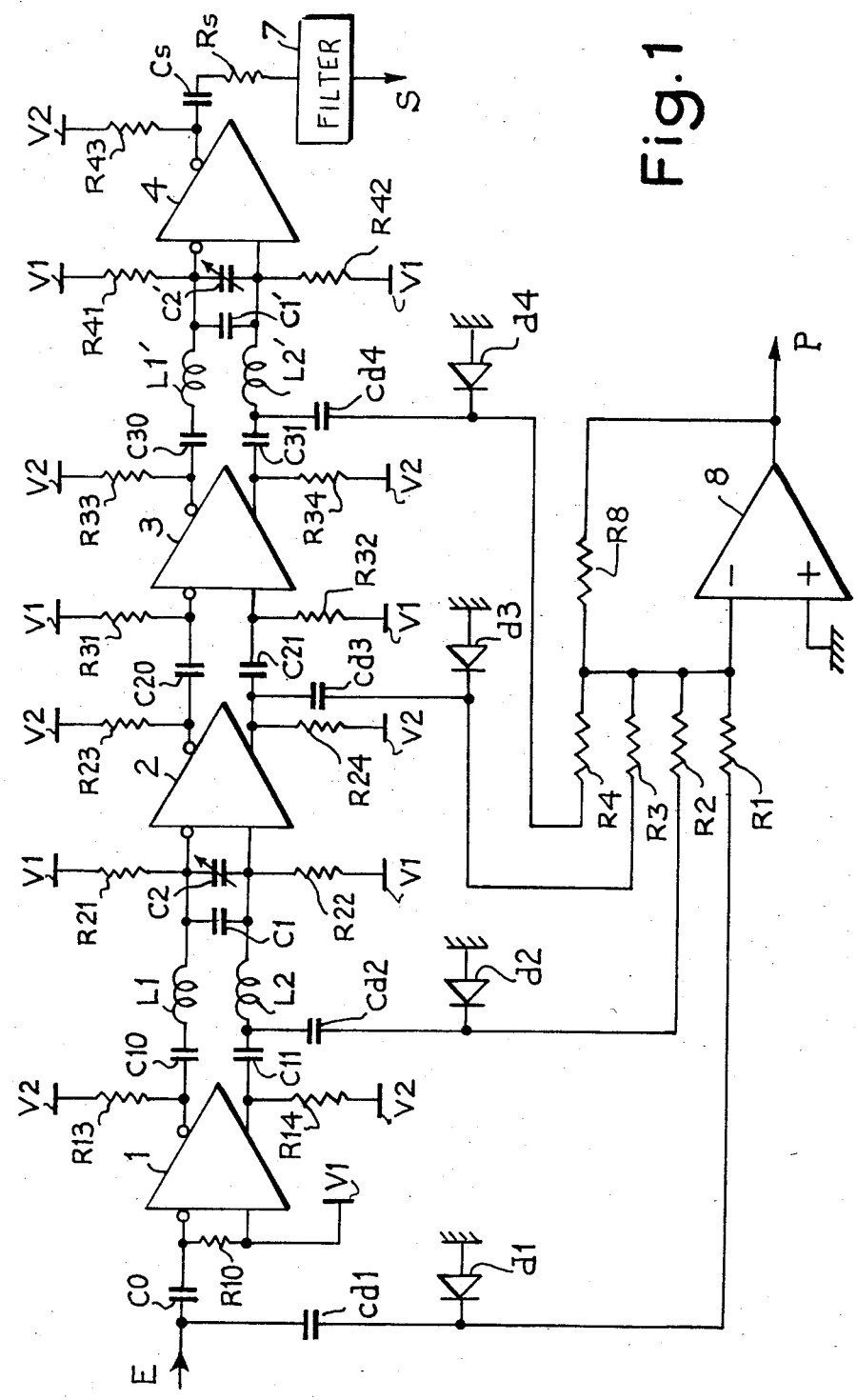
FIG. 1 illustrates a first embodiment of an amplifier-limiter device in accordance with the invention.

FIG. 1 illustrates an amplifier-limiter device which has added to it a detector assembly providing a logarithmic measurement of the power of its input signal.

The amplifier-limiter device according to FIG. 1 may be described as an amplifier-limiter arrangement comprising four amplifiers 1 to 4 formed by integrated circuits coupled in series, with a band pass output filter 7, and with a logarithmic detection assembly associated with this arrangement, the said detection assembly performing a detecting operation on the signals applied to the four integrated circuits and summates the signals obtained by detection by means of an output summator 8-R8.

FIG. 1 shows a signal input E to which is fed the signal which is to be amplified, the signal in question being one which is to be amplified to provide a signal at a constant level substantially equal to 0 dBm or say 1 mW at an output S, and which has to be detected to provide a voltage proportional to the value expressed in dBm of the power of the signal at the input E, to an auxiliary output P. The input E is connected via a decoupling capacitor Co of 1nF to the inversion input of the amplifier 1 which like the circuits 2 to 4 is an integrated logic circuit of the line receiver type of the emitter coupled kind (referred to in English literature as emitter coupled logic or E.C.L.) which has the dual function of an amplifier and of a voltage limiter. It is a MC 10H116 circuit in this case. The inverting and direct inputs of the amplifier 1 are connected via a resistor R10 of 51 ohms and the direct input is connected moreover to a source of voltage V1 of −1.3 volts. The inverting and direct outputs of the amplifier 1 are connected to a source of voltage V2 of −5.2 volts via, respectively, two biasing resistors R13 and R14 of 390 ohms. The inverting and direct outputs of the amplifier 1 are equally connected via a decoupling capacitor C10,C11 followed by an inductance L1,L2 of 33 nanohenrys, respectively, to the inverting and direct inputs of the amplifier 2. The inverting and direct inputs of the amplifier 2 are connected via a fixed capacitor C1 of 3.3 picofarads and a variable capacitor C2 connected in parallel, and these two inputs are coupled, respectively, to the source V1 via two resistors R21 and R22 of 560 ohms. The connection between the outputs of the amplifier 1 and the inputs of the amplifier 2, such as has been described, is a low-pass circuit connection. This low-pass inductance-capacitance circuit, which is also referred to as an L-C circuit, comprises the inductances L1,L2 and the capacitances C1,C2, being intended to establish a correction of the linear amplitude distortions of the pair of amplifiers 1-1. As a matter of fact, these amplifiers being formed by the line receivers of the emitter coupled logic type offer a single-pole linear transfer function at the rate of pulsation wn which in the case of the circuits in question corresponds to a frequency Fn of the order of 180 MHz, the L-C circuit formed by the elements L1,L2,C1,C2 introduces a transfer function having the form $$1 + j \cdot w \frac{2r}{wn} + \frac{1}{wn^2}(j \cdot wn)^2 - 1$$

in which j is the square root of −1, w the rate of pulsation and r the attenuation attributable to the L-C circuit, this transfer function compensating the distortions of the pair 1-2 up to say w=wn for r close to 0.25.

The inverting and direct outputs of the amplifier 2 are connected, respectively, to the source V2 via two resistors R23,R24 identical to the resistors R13 and R14, furthermore, the inverting and direct outputs of the amplifier 2 are connected to the inverting and direct inputs respectively of the amplifier 3 via decoupling capacitors C20,C21. Two biasing resistors R31 and R32 of 100 ohms connect the inverting and direct inputs respectively of the amplifier 3 to the voltage source V1.

The amplifier 3 is connected to the amplifier 4 by means of a connection identical to that joining the amplifiers 1 and 2, the amplifiers 3 and 4 in this way forming a second pair of amplifiers with their decoupling capacitors C30,C31, their L-C balancing circuit L1′, L2′,C1′,C2′ and their biasing resistors R33,R34,R41,R42, of which the elements are identical respectively to the elements C10,C11,L1,L2,C1,C2,R13,R14,R21,R22 and of which the biasing voltages are also the same as for the outputs of the amplifier 1 and the inputs of the amplifier 2.

The inverting output of the amplifier 4 is connected via a biasing resistor R43 of 390 ohms to the voltage source V2 and via a capacitor Cs of 1 nanofarad following by an impedance matching resistor Rs of 39 ohms, to the input of a filter 7 of which the band is selected as a function of the purpose for which the device is utilised. As above described, the device has a gain between its input E and the resistor Rs which may reach 69 decibels with a band pass extending from 10 MHz to 200 MHz.

The signal P from the auxiliary output, proportional to the value expressed in decibels with respect to a milliwatt (dBm) of the power of the signal at the input E is obtained by the conventional method of logarithmic detection. A detector is situated at the input of the amplifiers 1 to 4 and the voltages provided by the detectors are summated to yield the output signal P. For this purpose, the amplifier-limiter according to FIG. 1 comprises:

four decoupling capacitors Cd1,Cd2,Cd3,Cd4 of which a first plate is connected, respectively, to one of the plates of the four decoupling capscitors Co,C11,C21, C31, that is to say at points for measuring the input signals fed to the amplifiers 1 to 4 respectively, four identical diode detectors in parallel, d1-R1, d2-R2,d3-R3,d4-R4 each comprising a BAT 19 type diode such as d1, of which the anode is earthed and the cathode is connected to the second plate of the detection decoupling capacitor having the same index (Cd1 for the diode d1), and a resistor such as R1 of which a first extremity is connected to the cathode of the diode having the same index (d1 for the resistor R1), a summator circuit obtained by connecting the second extremities of the detector resistors R1 to R4 to the "minus" input of a differential amplifier 8 of which the "plus" input is connnected to earth and of which the output which forms the auxiliary output P is coupled via a resistor R8 to its "minus" input, R8 having the value of 1 megohm.

Figure 2:
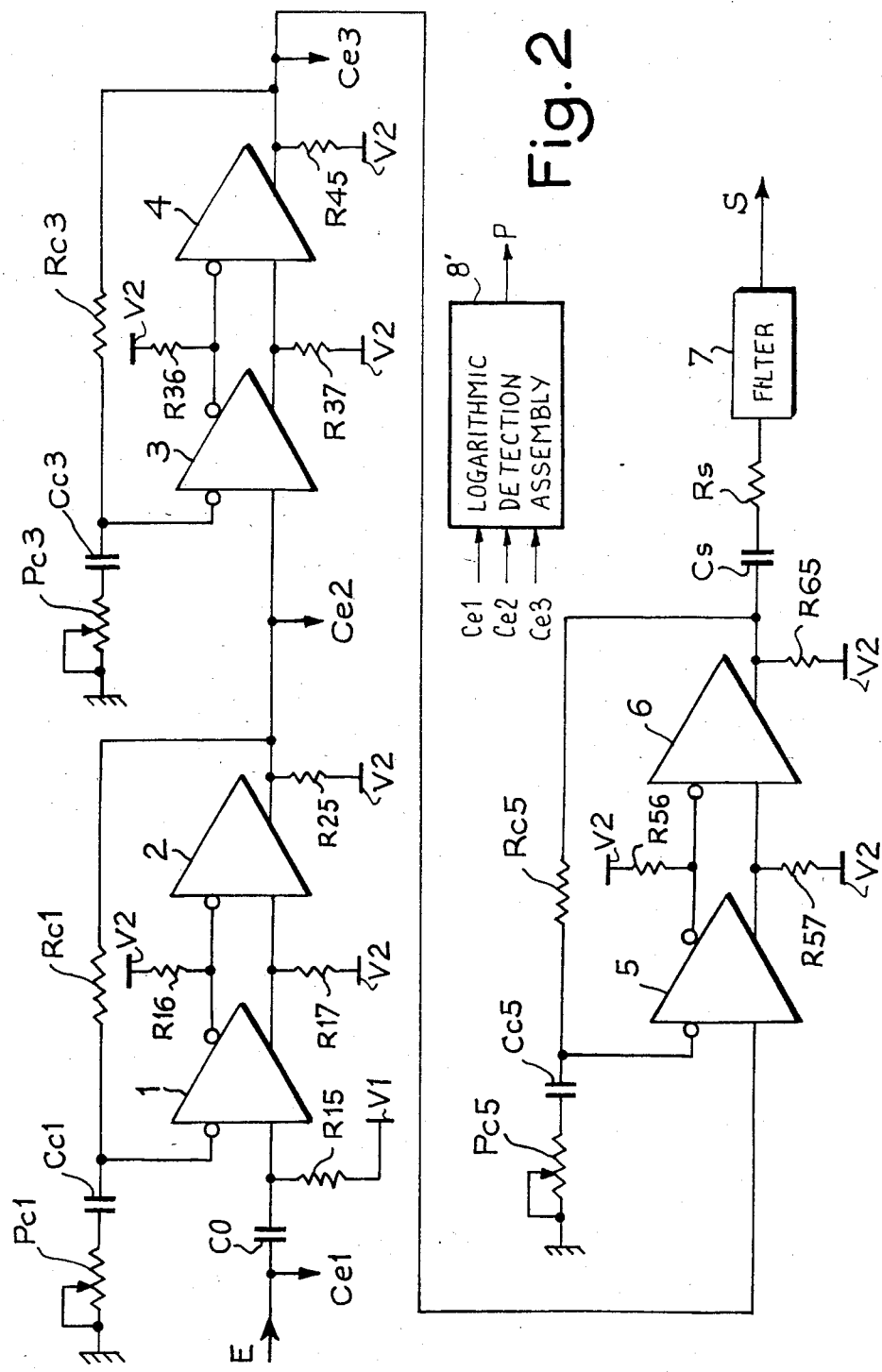
FIG. 2 illustrates a second embodiment of an amplifier-limiter device in accordance with the invention.

Another embodiment of an amplifier-limiter device in accordance with the invention is shown in FIG. 2. This other amplifier-limiter device comprising six amplifiers 1 to 6 analogous to the amplifiers 1 to 4 of FIG. 1, connected in series between an input E and an output S and forming three successive pairs 1-2,3-4,5-6 of amplifiers, with each pair having allocated to it a circuit compensating for the distortions caused by the pair in question. These three compensating circuits are feedback circuits which act between the direct output of the second amplifier of one pair and the inverting input of the first amplifier of the same pair. Each of the three feedback circuits comprises a resistor Rc1,Rc2,Rc3 of 2.4 kiloohms, connected between the two access points referred to in the foregoing and between which the circuit operates, and a capacitor Cc1,Cc2,Cc3 of 1 nanofarad, followed by a potentiometer Pc1,Pc2,Pc3 of 100 ohms, these two elements being connected between the inverting input of the first amplifer of the pair in question, and earth.

The connections between the input E and the output S of the amplifier-limiter device according to FIG. 2 comprise:

a connection via a capacitor Co between the input E and the direct input of the amplifier 1, a connection via a capacitor Cs followed by an impedance matching resistor Rs and by a filter 7, similar to the corresponding elements of FIG. 1, between the direct output of the amplifier 6 and the output S, a connection via two conductors between the inverting and direct outputs of the first amplifier of a pair and, respectively, the inverting and direct inputs of the second amplifier of the pair in question, and a connection via a single conductor between two successive pairs, this connection being establshed between the direct output of the second amplifier 2,4 of one pair and the direct input of the first amplifier 3,5 of the following pair.

FIG. 2 also shows the biasing resistors for the direct inputs and outputs of the amplifiers 1 to 6, as well as in each pair, the biasing resistors for the inverting output of the first amplifier of the pair in question and for the inverting input of the second amplifier of the same pair. These are the following resistors: R15 connected between the direct input of the amplifier 1 and a voltage source V1 of −1.3 volts, R16 and R17 between respectively the inverting and direct outputs of the amplifier 1 and a voltage source V2 of −5.2 volts, R25 between the direct output of the amplifier 2 and the source V2, R36 and R37 between respectively the inverting and direct outputs of the amplifier 3 and the source V2, R45 between the direct output of the amplifier 4 and the source V2, R56 and R57 between respectively the inverting and direct outputs of the amplifier 5 and the source V2, and R65 between the direct output of the amplifier 6 and the source V2.

A signal of a constant level equal to 1 mw is provided at its output S by the circuit described with reference to FIG. 2. It has a gain of 80 dB and a band pass of 300 MHz. It should be pointed out that the mean gain per amplifier is smaller than in the case of the embodiment according to FIG. 1, that is to say 80 dB for six amplifiers instead of 69 dB for four amplifiers. By contrast, in this amplifier-limiter device providing compensation by feedback, the quality of transmission is improved as compared to that obtained with the device according to FIG. 1.

The logarithmic detection assembly 8' which makes it possible to provide a voltage proportional to the power in decibels with respect to a milliwatt of the signal fed to the input E, has only been denoted by a rectangle in FIG. 2. This permits simplifying the illustration without impeding a grasp of particular features of the invention. As a matter of fact, this particular logarithmic detection array is similar to that of FIG. 1, except that it comprises three instead of four diode detectors of which the output signals are summated by means of a summator similar to the summator 8-R8 of FIG. 1. In FIG. 2 moreover, the conductors running from the input E and the direct outputs of the amplifiers 2 and 4 towards the decoupling capacitors which are not shown and situated as in FIG. 1 at the input of each of the diode detectors of the logarithmic detector assembly, are shown with references Ce1 to Ce3. It should be pointed out that the detection assembly of the device according to FIG. 2 does, not comprise detection inputs connected to the connections between, respectively, the outputs of the amplifiers 1,3,5 and the inputs of the amplifiers 2,4,6 which is because the voltage in these three connections does not represent the signal transmitted from the input E towards the output S because of the negative or inverse feedback.

The invention is not restricted to the two embodiments described. The amplifier-limiter device may thus comprise only one pair of amplifiers with its associated compensating circuit or else more than three pairs, each having its compensating circuit, and use may similarly be made of other compensating circuits associated with a pair of amplifiers and the compensating circuit may possibly differ from one pair to the next if the number of pairs is at least equal to two.

What is claimed is:

1. An amplifier-limiter device which comprises: a signal input and a signal output, 2n integrated logic circuits of the line receiver emitter coupled type (n being an integer at least equal to 1), 2n+1 connections for establishing a coupling in series of the 2n circuits between the signal input and output, these 2n circuits forming n pairs of successive and separate circuits, and n compensating feedback circuits associated with the n pairs respectively, for compensating the linear distortion caused by the n pairs and for having band pass above 100 mHz.

2. An amplifier-limiter device according to claim 1, wherein the n compensating circuits are low-pass inductance-capacitance circuits connected respectively into the n linkages between the integrated circuits of one and the same pair.

3. An amplifier-limiter device according to claim 1, wherein the n compensating circuits are feedback circuits, wherein in each pair, that of the two integrated circuits which is the closest to the signal input comprises a feedback input and wherein for each pair, the associated feedback circuit couples the connection immediately following the pair in question to the feedback input of that of the two integrated circuits of the pair in question which is the closest to the signal input.

4. An amplifier-limiter device according to claim 1, which comprises a logarithmic detector assembly intended to provide a voltage proportional to the logarithmic value of the power of the signal to be amplified by the amplifier-limiter device, this assembly comprising: 2n detectors respectively coupled to the signal input and to the 2n−1 connections between the 2n integrated circuits to perform a detecting operation on the signals fed to these 2n integrated circuits, and a summator circuit for performing a summating operation on the signals provided by the 2n detectors.

5. An amplifier-limiter device according to claim 1, which comprises a logarithmic detector assembly for providing a voltage proportional to the logarithmic value of the power of the signal to be amplified by the amplifier-limiter device, this logarithmic detector assembly comprising: n detectors respectively coupled to the signal input and to the n−1 connections between the n pairs of integrated circuits to perform a detecting operation on the signals fed to these n pairs, and a summator circuit for performing a summating operation on the signals provided by the n detectors.

* * * * *